United States Patent
Cheung et al.

(10) Patent No.: US 6,750,066 B1
(45) Date of Patent: Jun. 15, 2004

(54) PRECISION HIGH-K INTERGATE DIELECTRIC LAYER

(75) Inventors: Fred TK Cheung, San Jose, CA (US); Arvind Halliyal, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 72 days.

(21) Appl. No.: 10/117,818

(22) Filed: Apr. 8, 2002

(51) Int. Cl.$^7$ .......................... H01I 21/20; H01L 21/48
(52) U.S. Cl. ........................ 438/3; 438/396; 438/287; 438/296; 438/297
(58) Field of Search .......................... 438/3, 396, 585, 438/573, 627, 633, 287, 296, 297

(56) References Cited

U.S. PATENT DOCUMENTS

| | | | | |
|---|---|---|---|---|
| 5,923,056 | A | * | 7/1999 | Lee et al. ..................... 257/192 |
| 6,013,553 | A | | 1/2000 | Wallace et al. ............. 438/287 |
| 6,020,024 | A | | 2/2000 | Maiti et al. ............... 427/248.1 |
| 6,100,204 | A | | 8/2000 | Gardner et al. ............. 438/765 |
| 6,144,060 | A | * | 11/2000 | Park et al. .................... 257/310 |
| 6,297,359 | B1 | * | 10/2001 | Young et al. ................ 530/350 |
| 6,320,784 | B1 | * | 11/2001 | Muralidhar et al. ......... 365/151 |
| 6,355,561 | B1 | * | 3/2002 | Sandhu et al. .............. 438/676 |
| 6,407,435 | B1 | * | 6/2002 | Ma et al. ..................... 257/411 |
| 6,441,417 | B1 | * | 8/2002 | Zhang et al. ............... 257/295 |
| 6,448,192 | B1 | * | 9/2002 | Kaushik ...................... 438/785 |
| 6,509,601 | B1 | * | 1/2003 | Lee et al. ..................... 257/310 |
| 6,511,867 | B2 | * | 1/2003 | Lowrey et al. ............. 438/128 |
| 6,511,873 | B2 | * | 1/2003 | Ballantine et al. .......... 438/239 |
| 6,511,876 | B2 | * | 1/2003 | Buchanan et al. ........... 438/240 |
| 6,534,395 | B2 | * | 3/2003 | Werkhoven et al. ......... 438/627 |
| 6,541,280 | B2 | * | 4/2003 | Kaushik et al. ................. 438/3 |
| 6,541,331 | B2 | * | 4/2003 | Chudzik et al. ............. 438/240 |
| 6,555,879 | B1 | * | 4/2003 | Krivokapic et al. ......... 257/382 |
| 6,559,472 | B2 | * | 5/2003 | Sandhu et al. ................. 257/31 |
| 6,576,053 | B1 | * | 6/2003 | Kim et al. ..................... 117/89 |
| 6,579,767 | B2 | * | 6/2003 | Park et al. .................... 438/287 |
| 6,586,792 | B2 | * | 7/2003 | Ahn et al. .................... 257/295 |

OTHER PUBLICATIONS

Novel Damage–free Direct Metal Gate Process Using Atomic Layer Deposition by Dae–Gyu Park et al., Advanced Process Team, Hyundai Electronics Industries Co., Ltd., Korea.

\* cited by examiner

*Primary Examiner*—Michael S. Lebentritt
(74) *Attorney, Agent, or Firm*—Renner, Otto, Boisselle & Sklar, LLP

(57) ABSTRACT

A semiconductor device which includes a precision high-K dielectric and formed on a semiconductor substrate and a method of forming the same. The semiconductor device includes at least one dielectric layer having a dielectric constant greater than $SiO_2$. The at least one dielectric layer is deposited by atomic layer deposition (ALD). The ALD deposited layer has precise uniformity, thickness and abrupt atomic interfaces.

9 Claims, 3 Drawing Sheets

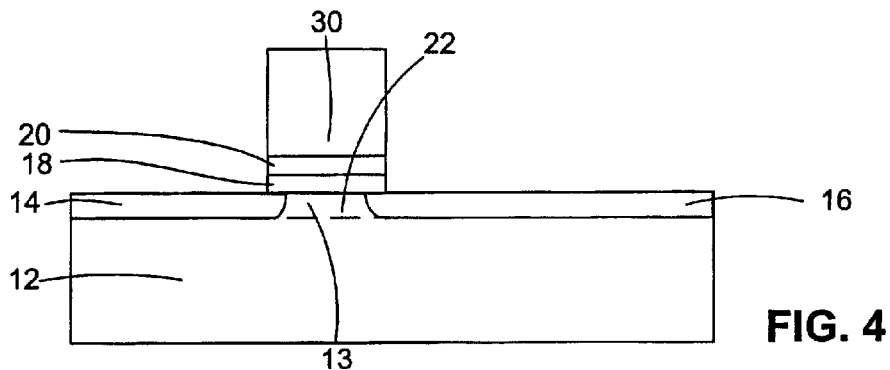
FIG. 3
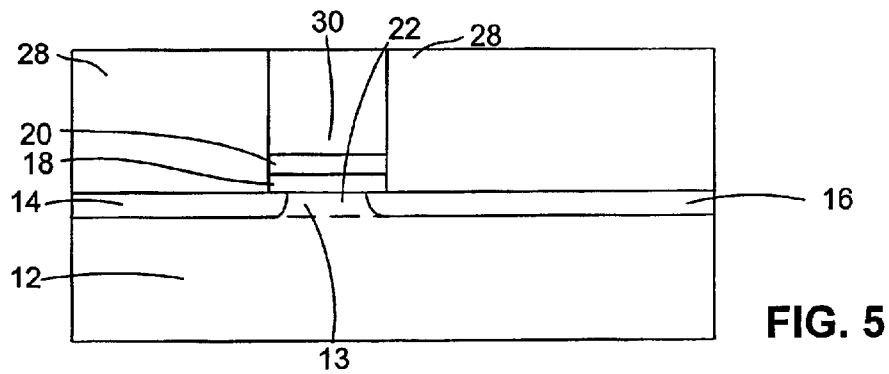
FIG. 4
FIG. 5
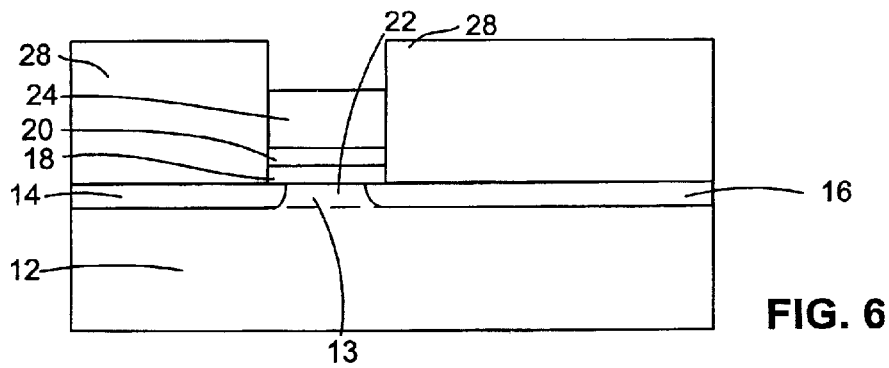
FIG. 6
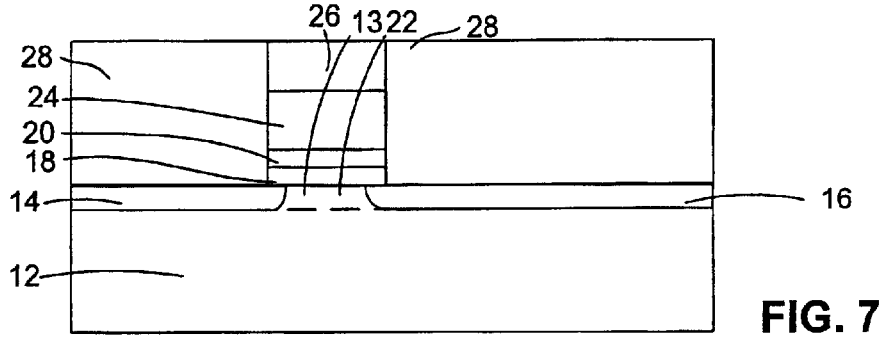
FIG. 7

PRECISION HIGH-K INTERGATE DIELECTRIC LAYER

TECHNICAL FIELD

The present invention generally relates to semiconductor devices having dielectric layers. In particular, the present invention relates to a precision high-K intergate dielectric layer and a method of forming the same.

BACKGROUND

A conventional floating gate FLASH memory device includes a FLASH memory cell characterized by a vertical stack on a semiconductor substrate. The semiconductor substrate is doped with either n-type or p-type impurities to form an active region in the semiconductor substrate. The vertical stack includes a gate dielectric, a floating gate, an intergate dielectric layer and a control gate. The gate dielectric of silicon dioxide ($SiO_2$ gate dielectric), for example, is formed on the semiconductor substrate. The floating gate (sometimes referred as the "charge storing layer") of polysilicon, for example, is formed on the gate dielectric. The intergate dielectric layer (e.g., layers of $SiO_2$, silicon nitride ("nitride") and $SiO_2$) is formed on the floating gate. The control gate of polysilicon, for example, is formed on the intergate dielectric layer. The floating gate formed on the $SiO_2$ gate dielectric defines a channel interposed between a source and a drain formed within the active region of the semiconductor substrate. The source and drain are formed by dopant impurities introduced into the semiconductor substrate.

Generally speaking, a FLASH memory cell is programmed by inducing hot electron injection from a portion of the semiconductor substrate, such as the channel section near the drain, to the floating gate. Electron injection introduces negative charge into the floating gate. The injection mechanism can be induced by grounding the source and a bulk portion of the semiconductor substrate and applying a relatively high positive voltage to the control gate to create an electron attracting field and applying a positive voltage of moderate magnitude to the drain in order to generate "hot" (high energy) electrons. After sufficient negative charge accumulates in the floating gate, the negative potential of the floating gate raises the threshold voltage of its field effect transistor (FET) and inhibits current flow through the channel during a subsequent "read" mode. The magnitude of the read current is used to determine whether or not a FLASH memory cell is programmed.

The act of discharging the floating gate of a FLASH memory cell is called the erase function. The erase function is typically carried out by a Fowler-Nordheim tunneling mechanism between the floating gate and the source of the transistor (source erase or negative gate erase), or between the floating gate and the semiconductor substrate (channel erase). A source erase operation is induced by applying a high positive voltage to the source and a 0 V to the control gate and the semiconductor substrate while floating the drain of the respective FLASH memory cell.

A pervasive trend in modern integrated circuit manufacture is to produce semiconductor devices, e.g., FLASH memory cells, having feature sizes as small as possible. Many present processes employ features, such as floating gates and interconnects, which have less than a 0.18 μm critical dimension. As feature sizes continue to decrease, the size of the resulting semiconductor device, as well as the interconnect between semiconductor devices, also decreases. Fabrication of smaller semiconductor devices allows more semiconductor devices to be placed on a single monolithic semiconductor substrate, thereby allowing relatively large circuit systems to be incorporated on a single, relatively small die area As semiconductor device feature sizes decrease, the thicknesses of the $SiO_2$ layers in the intergate dielectric layer decrease as well. This decrease in $SiO_2$ layer thickness is driven in part by the demands of overall device scaling. As floating gate widths decrease, for example, other device dimensions must also decrease in order to maintain proper device operation. Early semiconductor device scaling techniques involved decreasing all dimensions and voltages by a constant scaling factor, to maintain constant electric fields in the device as the feature size decreased. This approach has given way to more flexible scaling guidelines which account for operating characteristics of short-channel devices. A maximum value of semiconductor device subthreshold current can be maintained while feature sizes shrink. Any or all of several quantities may be decreased by appropriate amounts including $SiO_2$ layer thickness, operating voltage, depletion width, and junction depth, for example.

As a result of the continuing decrease in feature size, $SiO_2$ layer thickness has been reduced so much that $SiO_2$ layers of the intergate dielectric layer are approaching thicknesses on the order of ten angstroms (Å) (1 nm). Unfortunately, thin $SiO_2$ layers may break down when subjected to an electric field, particularly $SiO_2$ layers less than 50 angstroms (Å) (10 nm) thick of the intergate dielectric layer. It is probable that even for a relatively low gate voltage of 3V, electrons can pass through such thin $SiO_2$ layers by a quantum mechanical tunneling effect. In this manner, a leakage current may undesirably form between the control gate and the floating gate, adversely affecting the operability of the device. For example, the leakage current increases exponentially for about a two-fold decrease in thickness of a $SiO_2$ layer. The exponential increase in the $SiO_2$ layer leakage current significantly affects the operation of semiconductor devices, particularly with regard to standby power, dissipation, reliability and lifetime.

Another disadvantage of thin $SiO_2$ layers is that some electrons may become entrapped within the $SiO_2$ layers by, e.g., dangling bonds. As a result, a net negative charge density may form in the $SiO_2$ layers of the intergate dielectric layer. As the trapped charge accumulates with time, the threshold voltage $V_T$ may shift from its design specification.

Still another disadvantage of thin $SiO_2$ layers is that a breakdown of the $SiO_2$ layers may also occur at even lower values of gate voltage, as a result of defects in the $SiO_2$ layers. Such defects are unfortunately prevalent in relatively thin $SiO_2$ layers. For example, a thin $SiO_2$ layer often contains pinholes and/or localized voids due to unevenness at which the $SiO_2$ layer grows on a less than perfect silicon lattice or is deposited on the nitride layer.

Additionally, the deposition of thin $SiO_2$ layers is more difficult to control due to inherent limitations of the deposition process. As devices are produced having layers with thicknesses on the order of a few monolayers, the thickness variation of these layers over a 200-mm or 300-mm silicon wafer is of substantial concern. A variation in thickness of only 1.0 angstrom (Å) (0.1 nm) could result in changes in the device operating conditions. For example, the electron or hole mobility or the device transconductance may be affected. Additionally, variations in layer thickness make it extremely difficult to maintain device tolerances. Further, the layer thicknesses not only vary within a wafer, but also vary from lot to lot which affects the manufacturing of wafers.

Therefore, there exists a strong need in the art for a dielectric layer which incorporates a high-K dielectric material which is formed with precise uniformity, thickness, abrupt atomic interfaces, etc., in order for semiconductor devices to be further scaled without reducing the data retention of the finished device. Additionally, the relatively high-K material increases the electric field in the intergate dielectric layer such that in an erase mode electrons in the charge storing layer will tunnel through the relatively low-K material of the $SiO_2$ gate dielectric.

SUMMARY OF THE INVENTION

One promising approach for maintaining the capacitance and thickness of the intergate dielectric layer may be to increase the permittivity of a layer(s) in order to "reduce" an electrical equivalent thickness of the layer(s) of the intergate dielectric layer. Permittivity, $\in$, of a material reflects the ability of the material to be polarized by an electric field. The permittivity of a material is typically described as its permittivity normalized to the permittivity of a vacuum, $\in_0$. Hence, the relative permittivity, referred to as the dielectric constant, of a material is defined as:

$$K=\in/\in_0$$

While $SiO_2$ (sometimes simply referred to as "oxide") has a dielectric constant of approximately 3.9, other materials have higher K values. Silicon nitride ("nitride"), for example, has a K of about 6 to 9 (depending on formation conditions) and aluminum oxide ($Al_2O_3$) has a K of about 9 to 10. Much higher K values of, for example, 20 or more can be obtained with various transition metal oxides including tantalum oxide ($Ta_2O_5$), barium strontium titanate ("BST"), and lead zirconate titanate ("PZT").

For example, using a dielectric material with a higher K for one or more of the layers of the intergate dielectric layer would allow a high capacitance and an electrical equivalent thickness of a thinner ONO layer to be achieved. Further, the physical thickness of the intergate dielectric layer can be reduced by using atomic layer deposition (ALD) for depositing the high-K material for the intergate dielectric layer(s). Additionally, ALD ensures the deposition of the high-K material with precise uniformity, thickness and abrupt atomic interfaces. For example, an $Al_2O_3$ layer with a physical thickness of 10 angstroms (Å) (1 nm) can be deposited using ALD such that the variation in thickness is less than about 0.5 angstroms (Å) (0.05 nm) to about less than 0.1 angstroms (Å) (0.01 nm) across a 200-mm wafer. Thus, an intergate dielectric layer of $Al_2O_3$ having an electrical equivalent thickness of 1 angstrom (Å) (0.1 nm) of $SiO_2$ would have a physical thickness of about 10 angstroms (Å) (1 nm). Alternatively, the intergate dielectric layer may be formed of more than one layer. For example, a nitride layer with a K of 7.8 and a physical thickness of 50 angstroms (Å) (5 nm) is substantially electrically equivalent to a $SiO_2$ layer having a physical thickness of 25 angstroms (Å) (2.5 nm). Thus, an intergate dielectric layer including two $Al_2O_3$ layers of 10 angstroms (Å) (1 nm) (each) and a nitride layer of 50 angstroms (Å) (5 nm) would have an electrical equivalent thickness of 27 angstroms (Å) (2.7 nm) of $SiO_2$, but have a physical thickness of 70 angstroms (Å) (7 nm). Therefore, in one embodiment, the ONO layer can be replaced with an electrically thin high-K intergate layer that is also a physically thinner layer. It should be understood by those skilled in the art that the ONO layer, in an alternative embodiment, could be replaced with an electrically thin high-K intergate layer that is physically thicker than a conventional ONO of the same electrical equivalent thickness.

According to one aspect of the invention, the invention is a semiconductor device formed on a semiconductor substrate. The semiconductor device includes at least one dielectric layer having a dielectric constant greater than $SiO_2$. The at least one dielectric layer is deposited by atomic layer deposition (ALD). The ALD deposited layer has precise uniformity, thickness and abrupt atomic interfaces.

According to another aspect of the invention, the invention is a semiconductor device formed on a semiconductor substrate having an active region. The semiconductor device includes a gate dielectric layer disposed on the semiconductor substrate. A floating gate is formed on the gate dielectric layer wherein the floating gate defines a channel interposed between a source and a drain formed within the active region of the semiconductor substrate. A control gate is formed above the floating gate. Further, the semiconductor device includes an intergate dielectric layer interposed between the floating gate and the control gate wherein the intergate dielectric layer has a dielectric constant greater than $SiO_2$ and the intergate dielectric layer is deposited by atomic layer deposition (ALD).

According to another aspect of the invention, the invention is a method of fabricating a semiconductor device formed on a semiconductor substrate having an active region. The method includes the step of forming a gate dielectric layer on the semiconductor substrate. Further, the method includes the step of forming a source and a drain within the active region. The method fighter includes the steps of forming a floating gate on the gate dielectric layer wherein the floating gate defines a channel interposed between the source and drain and of forming a control gate above the floating gate. Additionally, the method includes the step of forming an intergate dielectric layer by atomic layer deposition (ALD) interposed between the floating gate and the control gate. The step of forming the intergate dielectric layer has a dielectric constant greater than $SiO_2$.

A reduction in the physical thickness of one or more of the $SiO_2$ layers of the intergate dielectric layer may adversely affect the performance of the finished device, such as the data retention of the FLASH memory device, and increase the difficulty of scaling the device for miniaturization and reduction of power consumption. The replacement of one or more of the $SiO_2$ layers of the ONO layer with a high-K material using ALD techniques allows further electrical scaling of the device. Additionally, the ALD techniques allow for the layer(s) to be manufactured at reduced thicknesses with high degrees of quality, precision, uniformity and thicknesses. Thus, the reliability, the quality, the speed, and the lifetime of the device are increased.

BRIEF DESCRIPTION OF THE DRAWINGS

FIG. 3 is a schematic cross-sectional view of a semiconductor substrate with the non-volatile memory device at an intermediate stage of manufacture in accordance with the present invention.

FIG. 4 is a schematic cross-sectional view of a semiconductor substrate with the non-volatile memory device at another intermediate stage of manufacture in accordance with the present invention.

FIG. 5 is a schematic cross-sectional view of a semiconductor substrate with the non-volatile memory device at another intermediate stage of manufacture in accordance with the present invention.

FIG. 6 is a schematic cross-sectional view of a semiconductor substrate with the non-volatile memory device at another intermediate stage of manufacture in accordance with the present invention.

FIG. 7 is a schematic cross-sectional view of a semiconductor substrate with the non-volatile memory device at another intermediate stage of manufacture in accordance with the present invention.

DETAILED DESCRIPTION

Figure 1:
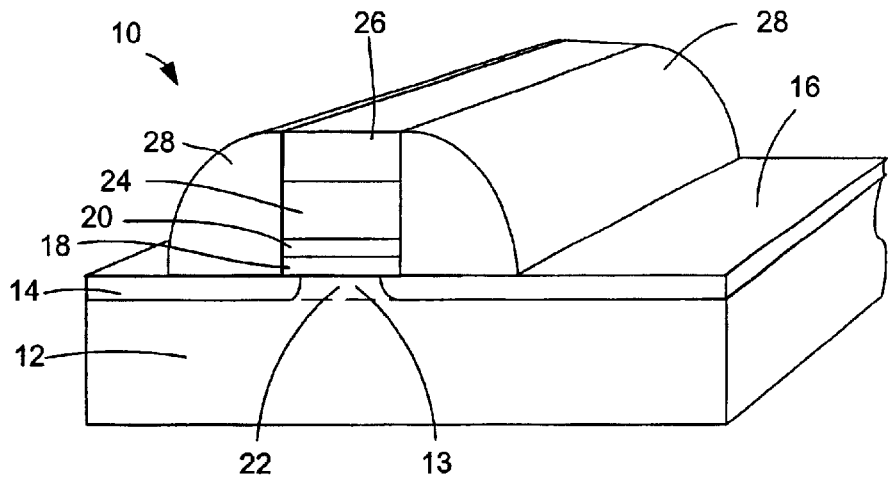
FIG. 1 is a perspective cross-sectional view of a non-volatile memory device including an embodiment of an intergate dielectric layer in accordance with the present invention.

To illustrate the present invention in a clear and concise manner, the drawings may not necessarily be to scale and certain features may be shown in somewhat schematic form.

The present invention is described hereinbelow in terms of a common semiconductor device, specifically, a FLASH memory cell formed on a semiconductor substrate. The present invention is not limited to this illustrative embodiment, however, and maybe applied to any semiconductor device in which a dielectric layer is needed, for example, as a gate dielectric in a FET, as an intergate dielectric layer in a floating gate EEPROM FLASH memory device, or the ONO layer in a SONOS-type FLASH memory device, such as the Mirror-Bit™ SONOS-type FLASH memory device available from AMD. Thus, it is to be understood that the present invention is not limited to the specific illustrative embodiments described below.

The present invention relates to a semiconductor device and to a method of making the semiconductor device. The semiconductor device includes an intergate dielectric layer of a high-K dielectric material interposed between the floating gate and the control gate. It should be understood by those skilled in the art that the intergate dielectric layer of high-K dielectric material may be one or more layers. Further, the invention may be a dielectric layer of high-K dielectric material interposed between a gate and a semiconductor substrate.

Thus, in an exemplary embodiment, the present invention relates to a semiconductor device having a high-K intergate dielectric layer. The semiconductor device includes a semiconductor substrate and a FLASH memory cell formed thereon. The FLASH memory cell is characterized by a vertical stack. The vertical stack includes a floating gate, an intergate dielectric layer, and a control gate. The intergate dielectric layer includes and/or is formed from a dielectric material on the floating gate. The dielectric material is a high-K dielectric material relative to $SiO_2$. In this exemplary embodiment, the dielectric material is an aluminum oxide material having a high-K dielectric relative to $SiO_2$. Thus, the intergate dielectric layer is an improved intergate dielectric layer.

In one embodiment, the intergate dielectric layer has a physical thickness less than a conventional ONO layer. In such case, the intergate dielectric layer may have an electrical equivalent thickness significantly less than the conventional ONO layer as will be further described below. The dielectric material may be, for example, $Al_2O_3$. $Al_2O_3$ has a dielectric constant of approximately 9.6 or approximately 2.5 times that of $SiO_2$ (K=3.9). Therefore, the intergate dielectric layer may be formed to a physical thickness of approximately 10 angstroms (Å) (1 nm). Such an intergate dielectric layer would have an electrical thickness equivalent of 1 angstrom (Å) (0.1 nm) of $SiO_2$.

A conventional ONO layer having a physical thickness of 175 angstroms (Å) (17.5 nm) (i.e., two $SiO_2$ layers each with a physical thickness of 62.5 angstroms (Å) (6.25 nm) and a nitride layer with a physical thickness of 50 angstroms (Å) (5 nm)) is electrically equivalent to 150 angstroms (Å) (15 nm) of $SiO_2$. Thus in order to further scale a semiconductor device, the conventional ONO layer can be replaced with the intergate dielectric layer having 1/150 the electrical equivalent thickness (i.e., 1 angstrom (Å) (0.1 nm)) of $SiO_2$ and the physical thickness of 10 angstroms (Å) (1 nm). Such an intergate dielectric layer of $Al_2O_3$ may be manufactured using ALD techniques that result in a higher quality layer as discussed above. The reduced thickness of the $Al_2O_3$ layer provides greater flexibility in the manufacture of the device.

Figure 2:
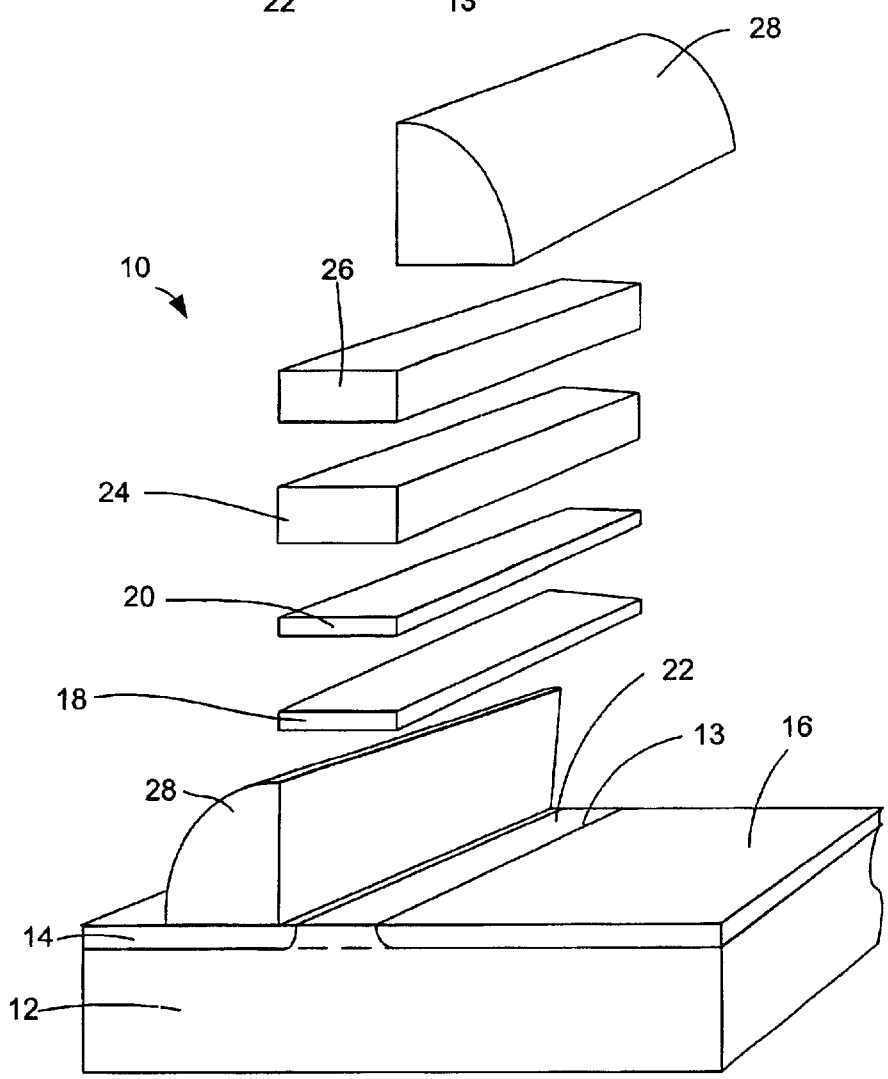
FIG. 2 is a exploded perspective cross-sectional view of the non-volatile memory device including the embodiment of the intergate dielectric layer in accordance with the present invention.
Figure 8:
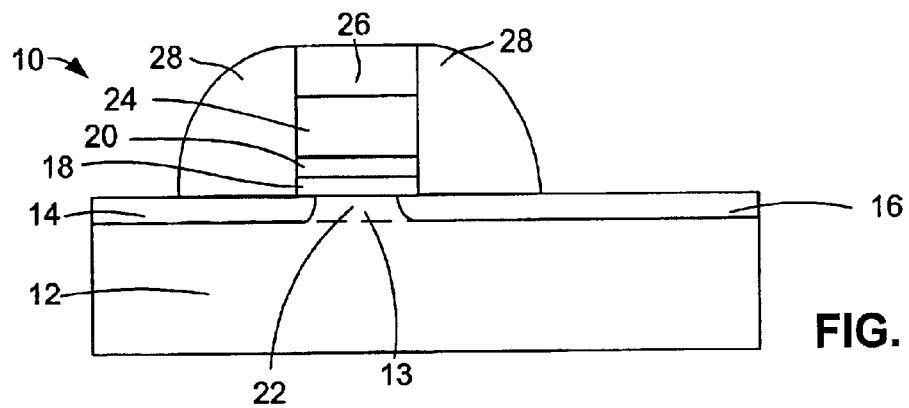
FIG. 8 is a schematic cross-sectional view of a semiconductor substrate with the non-volatile memory device at another intermediate stage of manufacture in accordance with the present invention.

FIGS. 1 and 2 show a semiconductor device of the present invention generally designated as 10. FIG. 1 shows the semiconductor device 10 in a perspective view and FIG. 2 shows the semiconductor device 10 in an exploded perspective view. The semiconductor device 10 comprises a semiconductor substrate 12 having an active region 13. The active region 13 may have a thickness of between 800 and 1000 angstroms (Å) (80 and 100 nm). A source 14 and a drain 16 are formed in the active region 13. A gate dielectric 18 is formed on the semiconductor substrate 12. A floating gate 20 is formed on the gate dielectric 18. The floating gate 20 defines a channel 22 between the source 14 and the drain 16. An intergate dielectric layer 24 is formed on the floating gate 20. The intergate dielectric layer 24 is formed of a high-K dielectric material. A control gate 26 is formed on the intergate dielectric layer 24. The gate dielectric 18, the floating gate 20, the intergate dielectric layer 24, and the control gate 26 form a vertical stack characteristic of a FLASH memory cell. Spacers 28 are formed on the sidewalls of the vertical stack. Isolation techniques that are known in the art may be used to electrically isolate the semiconductor device 10 from other semiconductor devices.

In one embodiment, the semiconductor substrate 12 is a bulk silicon semiconductor substrate. In one embodiment, the semiconductor substrate 12 is a silicon-on-insulator semiconductor substrate. In another embodiment, the semiconductor substrate 12 is a p-doped silicon semiconductor substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

The active region 13 may be a p-type region or an n-type region formed in the semiconductor substrate 12. The active region 13 may be predoped prior to the manufacture of he floating gate 20 of the semiconductor device 10. The active region 13 may be doped with p-type dopings for n-type channel devices and/or n-type dopings for p-type channel devices.

The source 14 and the drain 16 may be two N+ regions formed in the active region 13 of the semiconductor substrate 12. Alternatively, the source 14 and the drain 16 may be two P+ regions. In the exemplary embodiment illustrated in FIG. 1, the source 14 and the drain 16 are shown as respective deep implant regions. However, it should be understood that shallow extension regions could also be formed extending from the respective deep implant regions.

The gate dielectric 18 interposed between the floating gate 20 and the semiconductor substrate 12 is shown as a single layer dielectric. The gate dielectric 18 may be made of suitable gate dielectric materials including $SiO_2$ or of dielectric materials having a dielectric constant greater than $SiO_2$ (K=3.9) as will be further discussed below. In this exemplary embodiment, the gate dielectric 18 is made of $SiO_2$. The gate dielectric 18 may have a thickness of between 50 and 100 angstroms (Å) (5 and 10 nm), for example.

It should be understood by those skilled in the art that the gate dielectric 18 could be a multi-layer dielectric. For example, a layer of $SiO_2$ may be deposited on the semiconductor substrate followed by a layer of $Al_2O_3$. Alternatively, a layer of high-K material may be deposited on the semiconductor substrate followed by a layer of $SiO_2$ deposited on the high-K material. In another embodiment, three or more layers of dielectric material may be deposited in which one or more of the layers may be of a high-K dielectric material.

The floating gate 20 may be made of typical, well-known gate electrode materials, for example, polysilicon. The exemplary floating gate 20 may have a thickness of between 100 and 300 angstroms (Å) (10 and 30 nm).

The channel 22 may be a p-type region interposed between the source 14 and the drain 16. Alternatively, an n-type channel could be interposed between two P+ regions.

The intergate dielectric layer 24 is disposed on the floating gate 20. The intergate dielectric layer 24 is made of a high-K dielectric material as described below. The intergate dielectric layer 24 may be made of $Al_2O_3$ or may be made of another high-K dielectric material described below. The intergate dielectric layer 24 may have a thickness of between 10 and 200 angstroms (Å) (1 and 20 nm), for example. In one embodiment, the intergate dielectric layer 24 may have a thickness of between 10 and 50 angstroms (Å) (1 and 5 nm), for example. The intergate dielectric layer 24 may be deposited by ALD techniques which will be further described below.

On top of the intergate dielectric layer 24 is the control gate 26. The control gate 26 may be made of typical, well-known gate electrode materials, for example, polysilicon. The exemplary control gate 26 may have a thickness of between 200 and 600 angstroms (Å) (20 and 60 nm).

The spacers 28 are made of a dielectric material. The dielectric material may be $Si_xN_y$, $SiO_xN_y$, $Al_2O_3$, or may be made of another high-K dielectric material described below. The exemplary spacers 28 may have total heights between 400 and 1200 angstroms (Å) (40 and 120 nm). Further, the spacers 28 are shown as single layer spacers. However, the spacers 28 could be multi-layer spacers.

Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described. Nevertheless, how such parts could be added will be easily understood by those of skill in the art.

As used herein, the term "high-K dielectric" refers to a dielectric material having a K greater than $SiO_2$ (K=3.9). Such high-K dielectric materials include, for example, silicon oxynitride, which has a K of about 4 to about 8 depending on the relative content of oxygen and nitrogen; silicon nitride, which has a K of about 6 to about 9; $Al_2O_3$, which has a K of about 10; composite materials such as hafnium silicate, which has a K of about 14; hafnium silicon oxynitride, which has a K of about 16, depending on the relative content of oxygen and nitrogen; hafnium silicon nitride, which has a K of about 18; $HfO_2$, $ZrO_2$, $Ta_2O_5$ and others, some of which are identified more fully below.

Approximate K-values or, in some cases, a range of K-values, are shown below in Table 1 for several exemplary dielectric materials. It is understood that the present invention is not limited to the specific dielectric materials disclosed herein, but may include any appropriate high-K dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon nitride, $Si_xN_y$ | 6–9 |
| silicon oxynitride, $SiO_xN_y$ | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—200 |
| $PbTiO_3$ | ~20—200 |
| $BaTiO_3$ | ~20—200 |
| $SiTiO_3$ | ~20—200 |
| $PbZrO_3$ | ~20—200 |
| PST ($PbSc_xTa_{1-x}O_3$) | ~200—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to about 2.5, and y may vary from about 4.5 to about 5.5. In another embodiment, x may vary from about 1.75 to about 2.25, and y may vary from about 4.0 to about 6.0. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention further relates to a method of making the above-described semiconductor device 10. First, a semiconductor substrate 12, including an active region 13, is provided. Next, a gate dielectric 18 is deposited on the semiconductor substrate 12. Then, a floating gate 20 is deposited on the gate dielectric 18. Next, the semiconductor substrate 12 is doped to form a source 14 and a drain 16. Afterwards, a high-K dielectric material which will form an intergate dielectric layer 24 is deposited on the floating gate 20. Finally, a control gate 26 is deposited on the intergate dielectric layer 24. Together, the gate dielectric 18, the floating gate 20, the intergate dielectric layer 24 and the control gate 26 form a vertical stack on the semiconductor substrate 12 characteristic of a FLASH memory cell. Spacers 28 may be formed on the sidewalls of the vertical stack.

The high-K dielectric material is deposited by atomic layer deposition (ALD). In one embodiment, the high-K dielectric material is deposited by MOCVD. Alternatively, in another embodiment, nitrogen may be introduced into the high-K dielectric material in order to change the high-K dielectric material into a nitrided metal oxide. Thus, in one embodiment, the high-K dielectric material is modified by a nitridation method. In one embodiment, the high-K dielectric material is deposited by controlling the supply of precursor materials to the ALD apparatus. In one embodiment, the high-K dielectric materials are deposited in the same apparatus. In one embodiment, both the high-K dielectric materials are deposited sequentially by controlling the supply of precursor materials to the ALD apparatus. In an alternative embodiment, the layers may be deposited one at a time, in separate apparatuses. This alternative embodiment allows for different deposition methods to be used for the respective layers. For example, the oxide layers may be deposited using ALD techniques and a nitride layer may be deposited by LPCVD or PECVD. Further, a base layer may be deposited using chemical vapor deposition (CVD) techniques by any appropriate CVD method known in the art. Following deposition of a base layer, a precisely deposited top layer may be deposited using ALD.

Figure 9:
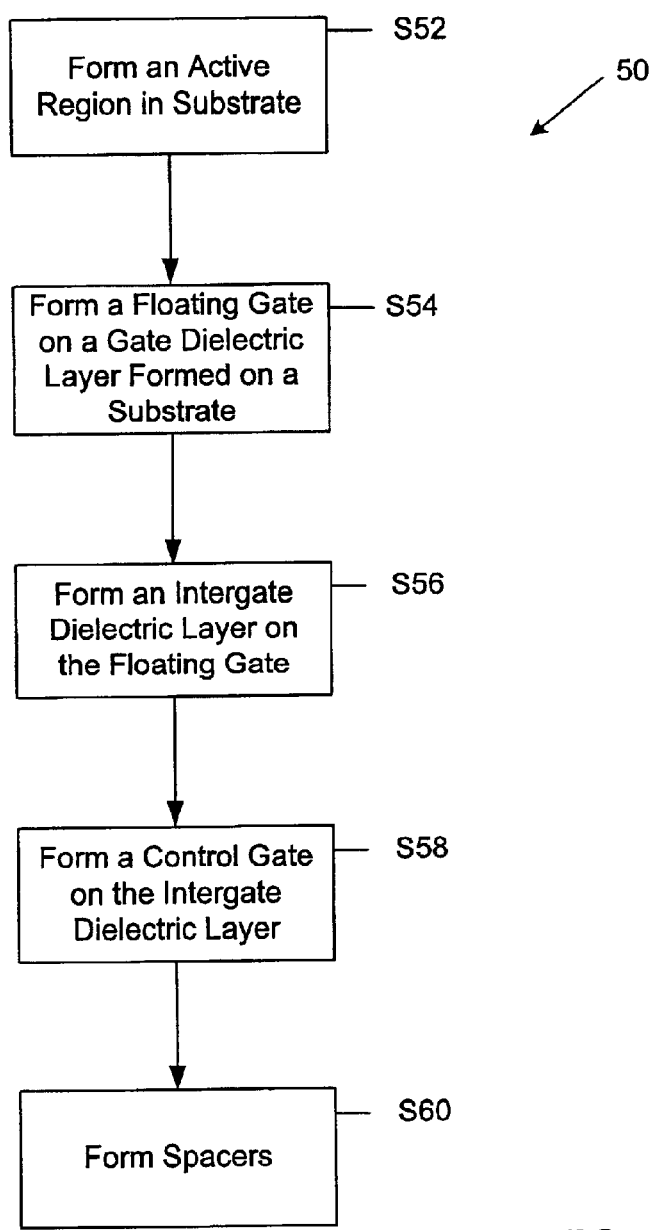
FIG. 9 is a schematic flow diagram showing the basic steps in a process of making a semiconductor device in accordance with the present invention.

The method of making the semiconductor device 10 having the intergate dielectric layer 24 is now described in detail with reference to FIGS. 3–9. FIG. 9 is a flow diagram 50 schematically presenting the steps of making the semiconductor device 10 of the present invention.

In the first step of the method of the present invention, shown in FIG. 9 as Step S52, the semiconductor substrate 12 is provided, as shown in FIG. 3. The semiconductor substrate 12 may be any appropriately selected semiconductor substrate known in the art, as described above. The semiconductor substrate 12 may be subjected to implants to provide the active region 13 in the semiconductor substrate 12 as is known in the art. For instance, boron or indium may be implanted to form a p-type region or channel for an n-type device and phosphorous or arsenic may be implanted to form an n-type region or channel for a p-type device. An exemplary range of concentration of these dopings is between $1 \times 10^{18}$ and $5 \times 10^{18}$ atoms/cm$^3$ for the p-type channel 22.

Now referring to FIG. 4 and Step S54, the gate dielectric 18 of $SiO_2$ is formed on the semiconductor substrate 12. The gate dielectric 18 of $SiO_2$ may be thermally grown or deposited to a thickness between 50 and 100 angstroms (Å) (5 and 10 nm). Then, the floating gate 20 is formed on the gate dielectric 18. Initially, an undoped layer of polysilicon may be deposited on the gate dielectric 18. The polysilicon layer of the floating gate 20 may be deposited to between about 200 and 400 angstroms (Å) (20 and 40 nm) thick. Following the deposition of the polysilicon layer, it may be polished back to a thickness of between 100 and 300 angstroms (Å) (10 and 30 nm) thick. Next, the polysilicon layer is patterned and etched to form the floating gate 20. Following the formation of the floating gate 20, an implantation step may be done at this time to implant the polysilicon of the floating gate 20. Alternatively, the polysilicon layer may be N+ predoped, for example.

Next, a nitride layer 30 is formed on the floating gate 20. The nitride layer 30 may be formed by a LPCVD process, for example. The nitride layer 30 would be deposited and patterned in order to protect the floating gate 20 from, for example, boron penetration, during an implant to form the source 14 and the drain 16.

Next, the semiconductor substrate 12 may be subjected to implants to produce the source 14 and the drain 16. The source 14 and the drain 16 may be formed by a main perpendicular implant. The main perpendicular implant is a relatively high energy, high concentration implant which is capable of producing the source 14 and the drain 16. Either boron, arsenic, or phosphorous may be used alone or in any combination as the dopant atoms. An exemplary range of implant dose of the perpendicular implant is between $1 \times 10^{15}$ and $2 \times 10^{15}$ atoms/cm$^2$. An exemplary range of concentration of these dopings is between $1 \times 10^{20}$ and $2 \times 10^{20}$ atoms/cm$^3$ for the source 14 and the drain 16. The dopants may be selected from other dopant materials known in the art Although the source 14 and the drain 16 are shown as main implantation regions, it should be understood that extension implantation may be done in order to form extension regions as is known in the art. It should also be understood that the formation of the source 14 and drain 16 may take place before the formation of the floating gate 20 or after the formation of the FLASH memory vertical stack.

In an exemplary ALD process, sequential deposition of a precursor, a purge gas and a co-reactant are introduced into an ALD chamber as a series of pulses. A complete cycle includes the following sequence: precursor/inert purge/co-reactant/inert purge, for example. The completion of one cycle results in the deposition of about 0.01 to about 1.0 monolayer of a metal-containing layer on the surface of the semiconductor substrate. The above monolayer range corresponds to a layer thickness of about 0.2 angstroms (Å) (0.02 nm). A preferred deposition temperature is from about 200° C. to about 400° C. The precursors may be the metal nitrate of any of the target metals of the high-K dielectric materials described above, for example, $Al(NO_3)_x$. The inert gases employed in the present invention include the use of inert gases such as He, Ar, $N_2$ and other like gases. The pulse duration of the precursor, the co-reactant and the inert gas may be from about 0.1 to about 5 seconds. The co-reactants are conventional oxidizing agents, nitride agents and reducing agents that are typically employed in ALD processes.

In the embodiment where the intergate dielectric layer is to be $Al_2O_3$, the precursor may be aluminum nitrate and the oxidant may be water. The precursor, reactant and an inert purge gas may be pulsed using the following sequence:
1. Aluminum Nitrate—0.5 seconds
2. Inert Purge—2 seconds
3. Water—0.5 seconds
4. Inert Purge—2.0 seconds Twenty (20) cycles may be used in providing an aluminum oxide layer having a thickness of 20 angstroms (Å). The use of ALD allows for the formation of layers which have atomically abrupt interfaces, excellent uniformity and fine thickness control. Further, ALD enables deposition of layers inside small vias and trenches with precise coverage.

Now referring to FIG. 5, a spacer layer 28 is deposited on the semiconductor substrate 12 and the nitride topped gate. The spacer layer 28 reaches between 500 and 1000 angstroms (Å) (50 and 100 nm) above the nitride layer 30 of the nitride topped gate. Next, the spacer layer 28 is polished back to the top surface of the nitride layer 30 of the nitride topped gate. The polishing is done using conventional techniques, which are well-known in the art. The spacer layer 28 may be a TEOS layer or other spacer material known to those skilled in the art.

In the third step of the method of the present invention, shown in FIG. 9 as Step S56, an etch of hot phosphoric acid is performed on the nitride layer 30 down to the floating gate 20. Thus, all of the nitride layer 30 is removed to leave an upper surface of the floating gate 20 exposed. It should be appreciated that other suitable selective etching methods well-known in the art may be used.

With reference to FIG. 6, the intergate dielectric layer 24 of high-K dielectric material (as described above) is formed on the floating gate 20 in an opening defined by the spacer layer 28 using techniques described below. In an exemplary embodiment, the intergate dielectric layer 24 is of $Al_2O_3$.

Now referring to FIG. 7 and Step S58, an undoped polysilicon layer 26 is deposited on the intergate dielectric layer 24 through the opening defined by the spacer layer 28. The undoped polysilicon layer 26 is deposited between 200 and 400 angstroms (Å) (20 and 40 nm) above the upper surface of the spacer layer 28. Next, the undoped polysilicon layer 26 is polished back to be even with the upper surface of the spacer layer 28. The polishing is done using conventional techniques, which are well-known in the art. The polysilicon may be N+ predoped or an implantation step may be done at this time to implant the polysilicon.

Subsequently, connections such as word lines may be formed using conventional techniques in order to establish electrical connections between the semiconductor device 10 and other nodes (such as an I/O pad or Vss), the source 14 or the drain 16 of the device as well as a power supply or a ground, if desired. The formation of the connections are not shown.

Next in Step S60, the spacer layer 28 is anisotropically etched with a suitable etchant. The spacer layer 28 is etched down to expose the top of the control gate 26 and the lateral surface of the semiconductor substrate 12, leaving the spacers 28 shown in FIG. 8. The spacers 28 may extend from the surface of the semiconductor substrate 12 to a height of between 400 and 1200 angstroms (Å) (40 and 120 nm).

After formation of the spacers 28, the semiconductor device 10 is subjected to rapid thermal annealing (RTA). Exemplary RTA may be performed for between 5 and 15 seconds at a temperature of 1020–1050° C.

The present invention enables further device scaling without adverse impact on device performance. In addition, the present invention improves deposition precision uniformity, thickness, abrupt atomic interfaces, etc., by enabling deposition of the intergate dielectric layer 24 (ONO layer) by an ALD process. Due to the inherent limitations of the CVD process, the control of oxide layer thickness becomes more difficult as dimensions shrink. By enabling a thinner and more accurately deposited oxide layer to be used as the intergate dielectric layer 24, the methodology of the present invention facilitates cost-effective device scaling and allows greater flexibility in oxide deposition. Additionally, the intergate dielectric layer 24 with a relatively high-K electrical equivalence improves the device operation.

Although particular embodiments of the invention have been described in detail, it is understood that the invention is not limited correspondingly in scope, but includes all changes, modifications and equivalents coming within the spirit and terms of the claims appended hereto. Additionally, although the flow diagram 50 FIG. 9 shows a specific order of execution, it is understood that the order of execution may differ from that which is depicted. For example, the order of execution of two or more blocks may be scrambled relative to the order shown. Also, two or more blocks shown in succession in FIG. 9 may be executed concurrently or with partial concurrence.

What is claimed is:

1. A method of fabricating a semiconductor device formed on a semiconductor substrate having an active region, the method comprising the steps of:

forming a gate dielectric layer on the semiconductor substrate;

forming a source and a drain within the active region of the semiconductor substrate;

forming a floating gate on the gate dielectric layer wherein the floating gate defines a channel interposed between the source and drain;

forming a control gate above the floating gate; and forming an undoped intergate dielectric layer by atomic layer deposition (ALD) interposed between the floating gate and the control gate, wherein the undoped intergate dielectric layer has a dielectric constant greater than $SiO_2$.

2. The method of claim 1, wherein the undoped intergate dielectric layer is deposited between 10 and 200 angstroms (Å) (1 and 20 nm) thick.

3. The method of claim 2, wherein the undoped intergate dielectric layer is deposited with precision such that the variation in thickness of the undoped intergate dielectric layer is less than about 0.1 angstroms (Å) (0.01 nm) per 200-mm.

4. The method of claim 1, further including the step of:

forming the gate dielectric layer of one or more of $SiO_2$, $Si_xN_y$, $SiO_xN_y$, $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

5. The method of claim 1, further including the step of forming the undoped integrate dielectric layer of one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

6. The method according to claim 5, further including the step of:

forming the undoped intergate dielectric layer of $Al_2O_3$.

7. A method of fabricating a semiconductor device on a semiconductor substrate, the method comprising the steps of:

forming at least one undoped dielectric layer having a dielectric constant greater than $SiO_2$, on a semiconductor substrate, wherein the at least one undoped dielectric layer is deposited by atomic layer deposition (ALD) and is an intergate dielectric layer interposed between a floating gate and a control gate.

8. The method according to claim 7, wherein an intergate dielectric layer material is one or more of $Al_2O_3$, $HfO_2$, $ZrO_2$, $Ta_2O_5$, $BaTiO_3$, $TiO_2$, $CeO_2$, BST ($Ba_{1x}Sr_xO_3$), PZN ($PbZn_xNb_{1-x}O_3$) and PST ($PbSc_xTa_{1-x}O_3$).

9. The method according to claim 8, wherein the intergate dielectric layer is $Al_2O_3$.

* * * * *

UNITED STATES PATENT AND TRADEMARK OFFICE
CERTIFICATE OF CORRECTION

PATENT NO. : 6,750,066 B1
DATED : June 15, 2004
INVENTOR(S) : Cheung et al.

It is certified that error appears in the above-identified patent and that said Letters Patent is hereby corrected as shown below:

Column 2,
Line 5, replace "area" with -- area. --.

Column 4,
Line 28, replace "fighter" with -- further --.

Column 5,
Line 31, replace "maybe" with -- may be --.

Column 6,
Line 60, replace "he" with -- the --.

Column 8,
Line 34, replace "$Ba_{1-x} Sr_x Tio_3$" with -- $Ba_{1-x} Sr_x TiO_3$ --.

Column 10,
Line 38, replace "art" with -- art. --.

Column 12,
Line 55, replace "integrate" with -- intergate --.

Signed and Sealed this

Thirtieth Day of November, 2004

JON W. DUDAS
*Director of the United States Patent and Trademark Office*